(12) United States Patent
Ku et al.

(10) Patent No.: US 10,054,627 B2
(45) Date of Patent: Aug. 21, 2018

(54) TESTING JIG

(71) Applicant: MPI CORPORATION, Zhubei (TW)

(72) Inventors: Wei-Cheng Ku, Zhubei (TW); Hao Wei, Zhubei (TW); Chia-Nan Chou, Zhubei (TW); Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 783 days.

(21) Appl. No.: 14/558,302

(22) Filed: Dec. 2, 2014

(65) Prior Publication Data

US 2015/0204906 A1    Jul. 23, 2015

(30) Foreign Application Priority Data

Dec. 13, 2013  (TW) .............................. 102146102 A

(51) Int. Cl.
*G01R 31/04* (2006.01)
*G01R 1/04* (2006.01)

(52) U.S. Cl.
CPC ......... *G01R 31/041* (2013.01); *G01R 1/0466* (2013.01)

(58) Field of Classification Search
CPC .. G01R 31/041; G01R 1/0466; G01R 1/0416; G01R 1/04; G01R 31/04
See application file for complete search history.

(56) References Cited

U.S. PATENT DOCUMENTS

| 6,343,940 | B1 * | 2/2002 | Khoury | G01R 1/06716 |
| | | | | 257/E23.004 |
| 6,927,588 | B1 * | 8/2005 | Snelgrove | G01R 1/0425 |
| | | | | 324/750.24 |
| 2002/0129323 | A1 * | 9/2002 | Kasukabe | G01R 31/2889 |
| | | | | 324/756.03 |
| 2015/0204906 | A1 | 7/2015 | Ku et al. | |

FOREIGN PATENT DOCUMENTS

| TW | M310341 | | 4/2007 | |
| TW | 201339583 A | * | 3/2012 | ............. G01R 1/073 |
| TW | 201339583 | | 10/2013 | |

* cited by examiner

*Primary Examiner* — Alesa Allgood
*Assistant Examiner* — Brent J Andrews
(74) *Attorney, Agent, or Firm* — Lynette Wylie; Apex Juris, pllc.

(57) ABSTRACT

A testing jig includes a substrate and a plurality of conductive elastic pieces, wherein the substrate has a recess and a plurality of circuits; the recess is located on a top surface of the substrate, while the circuits are provided on the top surface of the substrate. The conductive elastic pieces are provided on the substrate, and are respectively electrically connected to the circuits. Each of the conductive elastic pieces has a contact portion located within an orthographic projection range of the recess, wherein each of the contact portions contacts a pad of a DUT. Whereby, attenuation happens while transmitting test signals with high frequency can be effectively reduces by using the conductive elastic pieces to transmit test signals.

5 Claims, 6 Drawing Sheets

TESTING JIG

BACKGROUND OF THE INVENTION

1. Technical Field

The present invention relates generally to an appliance for electrical tests, and more particularly to a testing jig which contacts a DUT with conductive elastic pieces.

2. Description of Related Art

To check electrical connections between precision electronic components in an electronic product, probe cards are widely used as a communication interface for test signals and power signals transmitted between a test machine and a device under test (DUT). A probe card is mainly constructed by a plurality of probes and a rigid multilayer printed circuit board. By contacting a tested portion on a DUT with tips of the probes to transmit test signals thereto, electrical tests can be performed on the DUT.

With the advances in electronic technology, the processing speed of the DUT and signal transmission capacity per second increases, and therefore the frequency of test signals outputted by a test machine also rises. However, probes are quite slender, which causes higher inductance. Though the amount of inductance is still small, it greatly increases the resistance of the circuit while transmitting test signals in high frequency, which greatly attenuates test signals with high frequency, and consequently, leads to false reading of test signals.

BRIEF SUMMARY OF THE INVENTION

In view of the above, the primary objective of the present invention is to provide a testing jig, which is capable of transmitting test signals in high frequency.

The present invention provides a testing jig, which contacts a DUT with a plurality of pads thereon, wherein the testing jig includes a substrate and a plurality of conductive elastic pieces. The substrate has a top surface, a recess located on the top surface, and a plurality of circuits located on the top surface. The conductive elastic pieces are provided on the substrate to be respectively electrically connected to the circuits, wherein each of the conductive elastic pieces has a contact portion located within an orthographic projection range of the recess to contact one of the pads of the DUT.

By using the conductive elastic pieces, attenuation of test signals transmitted in high frequency can be effectively reduced.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
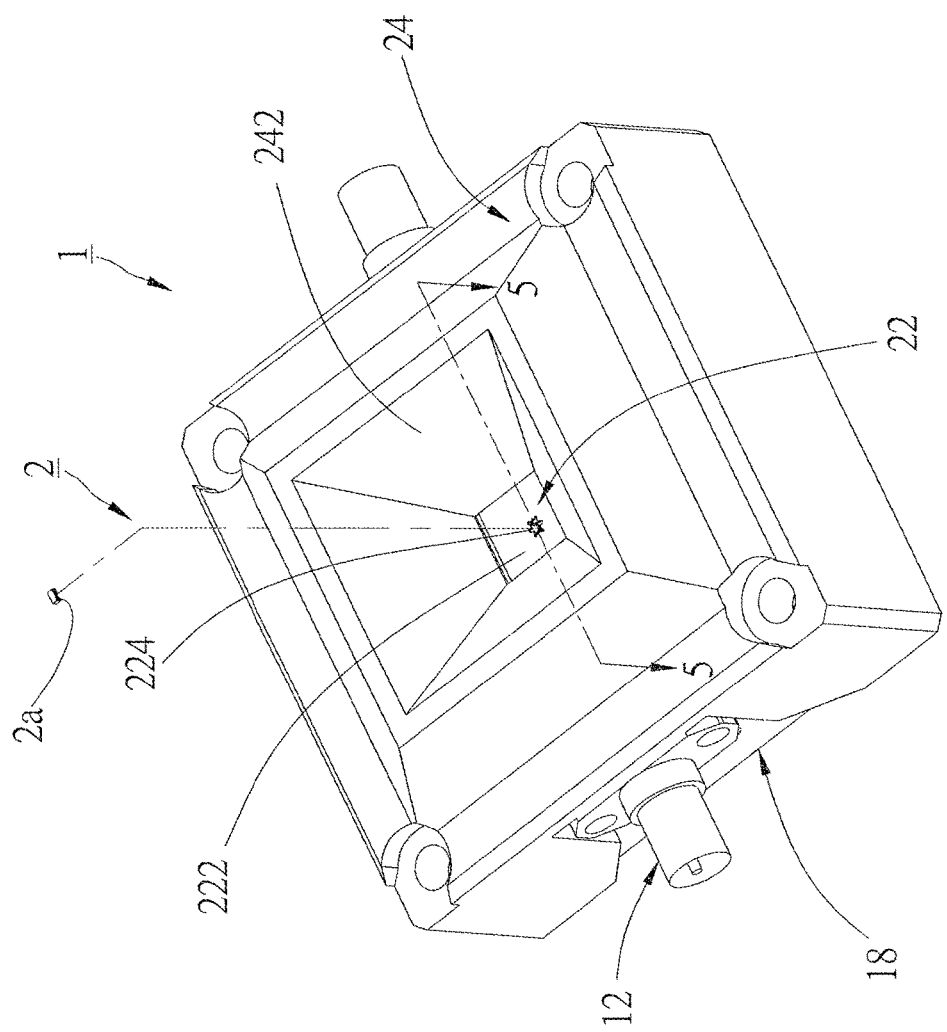
FIG. 1 is a perspective view of a preferred embodiment of the present invention.
Figure 2:
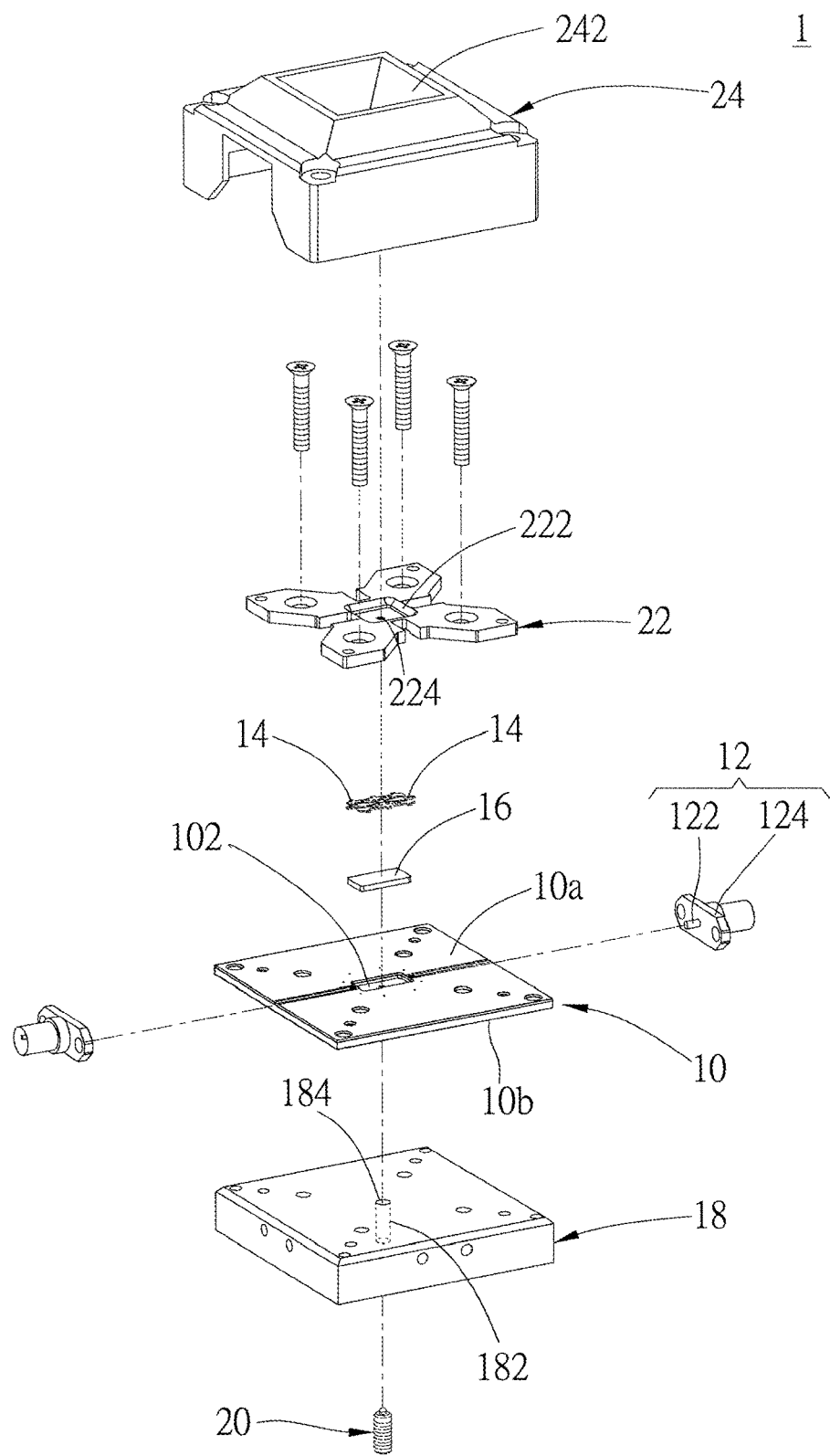
FIG. 2 is an exploded view of the preferred embodiment of the present invention.
Figure 3:
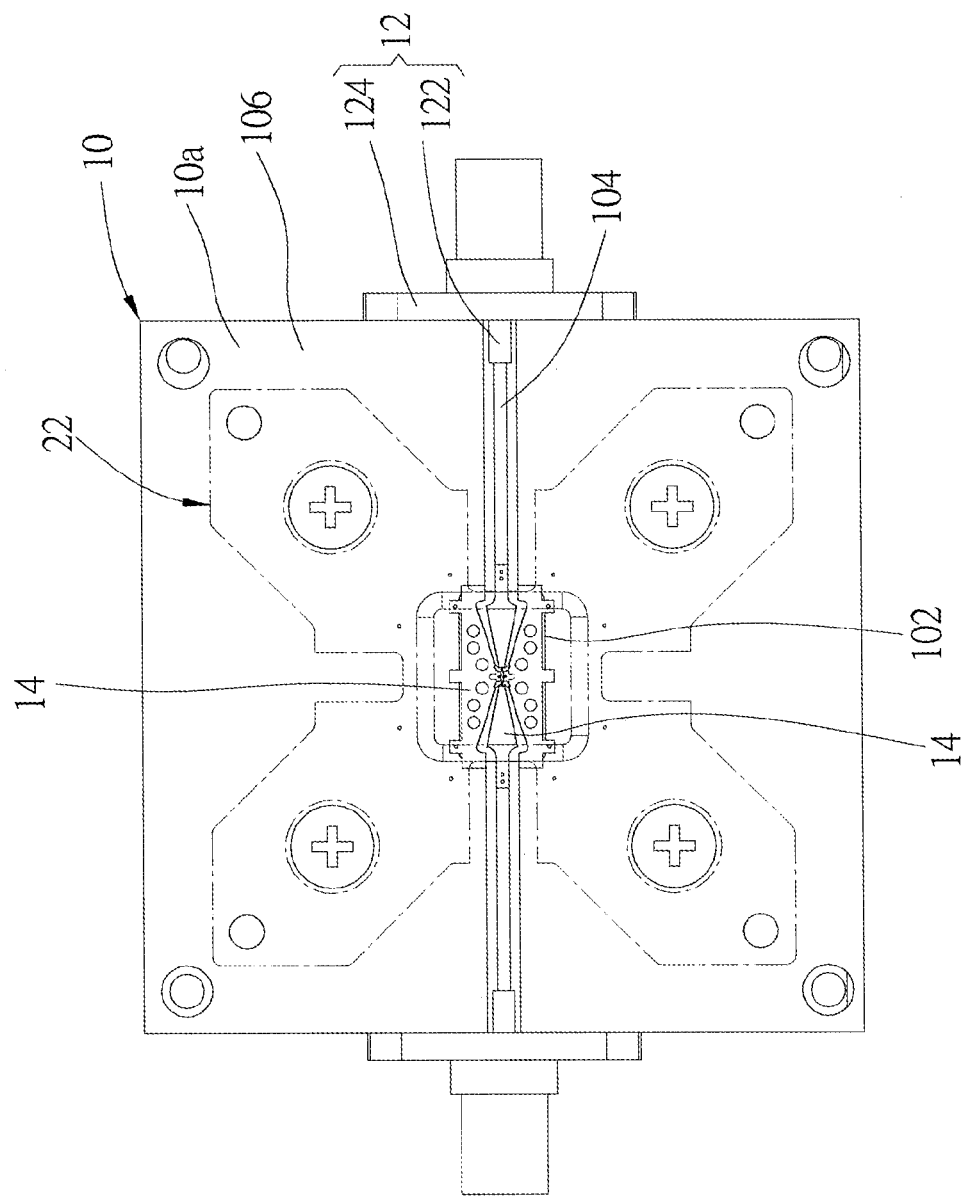
FIG. 3 is a partial top view of the preferred embodiment of the present invention.
Figure 4:
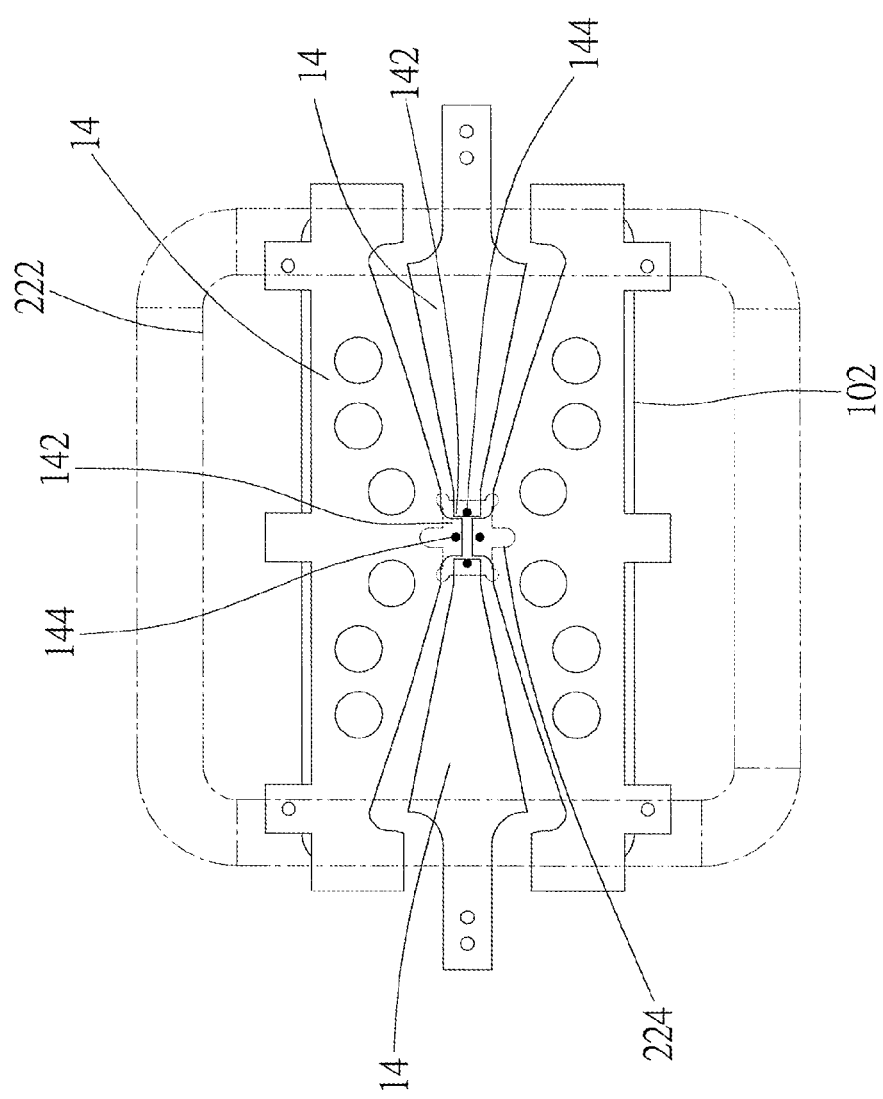
FIG. 4 is a partial enlarged top view of the preferred embodiment of the present invention.
Figure 5:
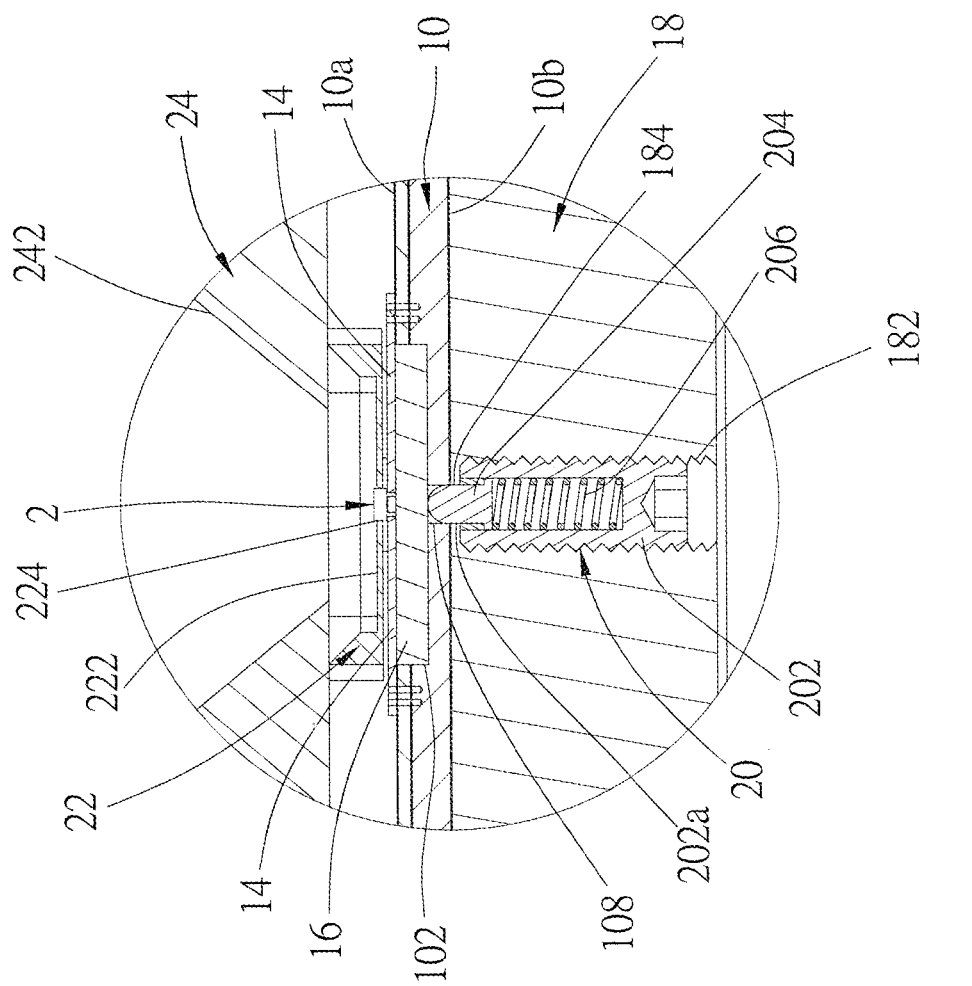
FIG. 5 is an enlarged sectional view along the 5-5 line in FIG. 1.

As shown in FIG. 1 to FIG. 5, a testing jig 1 of the preferred embodiment of the present invention is electrically connected to a device under test (DUT) 2, which includes a plurality of pads 2a, wherein the testing jig 1 includes a base 10, two connectors 12, a plurality of conductive elastic pieces 14, a cushion pad 16, a base 18, a flexible member 20, a positioning seat 22, and a case 24.

The substrate 10 is a rigid multilayer printed circuit board (PCB) in the preferred embodiment, which has a top surface 10a, a bottom surface 10b, a recess 102 formed on the top surface 10a, and a plurality of circuits provided on the top surface 10a. In the preferred embodiment, the circuits include two signal circuits 104 and two grounding circuits 106, wherein a part of each of the signal circuits 104 and a part of each of the grounding circuits 106a are located around the recess 102; another part of each of the signal circuits 104 and another part of each of the grounding circuits 106a reach the margin of the substrate 10. The substrate 10 has a perforation 108, which is located at the center of the recess 102, and communicates the recess 102 with the bottom surface 10b of the substrate 10.

Each of the connectors 12 has a signal electrode 122 and a metal cover 124 which are separated with each other. Each of the connectors 12 is respectively provided at opposite sides of the substrate 10. Furthermore, each of the signal electrode 122 is electrically connected to one of the signal circuits 104, while each of the covers 124 is electrically connected to the grounding circuits 106. The connectors 12 are used to connect the testing jig to a test machine (not shown) for electrical tests.

The conductive elastic pieces 14 are provided on the substrate 10, wherein a part of each of the conductive elastic pieces 14 is electrically connected to one of the signal circuits 104 or the grounding circuits 106 at a margin of the recess 102 respectively; another part of each of the conductive elastic pieces 14 extends inwardly from the margin of the recess 102 to fall with an orthographic projection range of the recess 102. In this way, each of the conductive elastic pieces 14 can have certain flexibility. Each of the conductive elastic pieces 14 has an end 142 located above the perforation 108 of the substrate 10, wherein the end 142 of each of the conductive elastic pieces 14 has a contact portion, which is a bump 144 provided on a top surface of the belonged conductive elastic piece 14 as an example, to contact one of the pads 2a of the DUT 2. In practice, the bump 144 can be omitted, and the top surface of the end 142 of each conductive elastic piece 14 is the contact portion which contacts one of the pads 2a of the DUT 2.

The cushion pad 16 is provided in the recess 102 to contact a bottom surface of each of the conductive elastic pieces 14. The cushion pad 16 is made of flexible materials, such as silica gel or rubber. The cushion pad 16 supports the conductive elastic pieces 14a to prevent the conductive elastic pieces 14 from being over bent which may cause unrecoverable deformation.

The base 18 is provided under the substrate 10, wherein a bottom of the base 18 is provided with a threaded hole 182, while a top of the base 18 is provided with a through hole 184 which communicates with the threaded hole 182. The through hole 184 corresponds to the perforation 108 of the substrate 10.

In the preferred embodiment, the flexible member 20 includes a threaded tube 202, a block 204, and a spring 206. The threaded tube 202 has an open end 202a, the block 204 and the spring 206 are located inside the threaded tube 202, wherein the block 204 extends out of the open end 202a to form a contact end of the flexible member 20. The threaded tube 202 is screwed into the threaded hole 182 of the base 18, whereby the block 204 extends into the perforation 108 of the substrate 10 to contact and abut against a bottom surface of the cushion pad 16. Since the block 204 is located below the bumps 144 of the conductive elastic pieces 14, if the DUT 2 is pressed downwardly to push the cushion pad 16, the spring 206 of the flexible member 20 pushes the block 204 back upwardly, which exerts an upward force on the bottom surface of the cushion pad 16. As a result, the bumps 144 of the conductive elastic pieces 14 constantly contact the pads 2a of the DUT 2, and therefore electrical signals can be smoothly transmitted between the bumps 144 of the conductive elastic pieces 14 and the pads 2a of the DUT 2.

The positioning seat 22 is provided on the top surface 10a of the substrate 10, wherein the positioning seat 22 has a recess 222 and a through hole 224, which is located in the recess 222 and reaches a bottom surface of the positioning seat 22; in other words, the through hole 244 communicates a top surface and the bottom surface of the positioning seat. Furthermore, the bumps of the conductive elastic pieces are located with an orthographic projection range of the through hole 224. The through hole 224 of the positioning seat 22 is provided to place the DUT 2, wherein the walls of the through hole 224 restrict the DUT 2 from being moved.

The case 24 is connected on the base 18 to encase the positioning seat 22 and the substrate 10 therein. The case 24 has a tapered opening 242, which communicates the inner side of the case 24 and outside. The cross sectional area of the tapered opening 242 becomes smaller toward the base 18. Specifically, the side of the tapered opening 242 which has the smallest cross sectional area corresponds to the recess 222 of the positioning seat 22, and communicates with the through hole 224 of the positioning seat 22. The tapered walls of the tapered opening 242 are helpful to guide a chuck (not shown) which holds the DUT 2 to pass therethrough, and therefore the DUT 2 can be quickly and steadily placed into the through hole 224 of the positioning seat 22.

Figure 6:
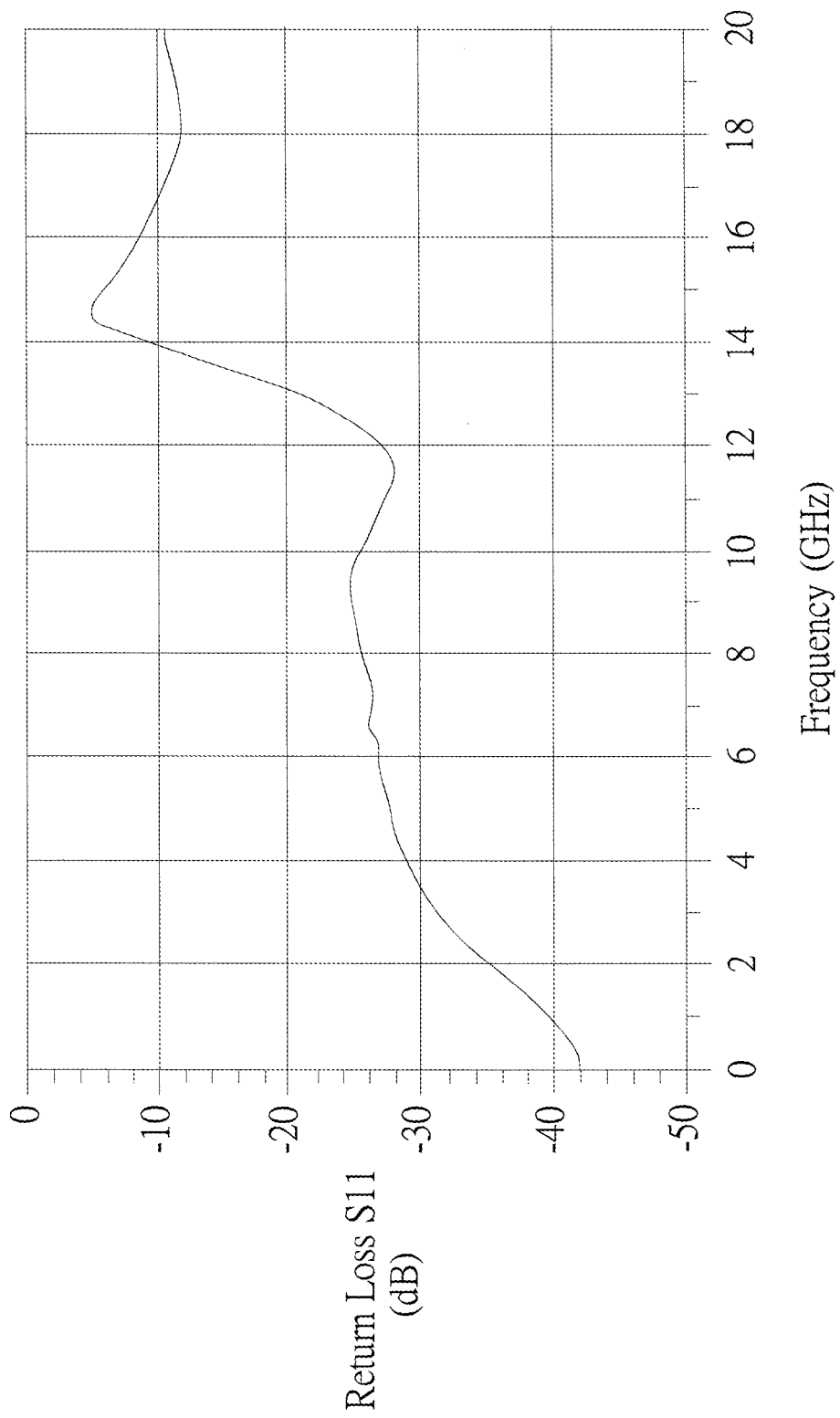
FIG. 6 is a diagram showing how much test signals of different frequency attenuate after passing through the preferred embodiment of the present invention.

With the aforementioned design, when the test machine is connected to the connector 12, and when test signals are transmitted from the test machine to the DUT 2, the return loss S11 can be maintained at around −20 dB after test signals of frequency higher than 13 GHz passing through the aforementioned signal circuit 104, grounding circuit 106, and conductive elastic pieces 14, which can be clearly seen in FIG. 6. Therefore, false reading of test signals of high frequency can be avoided.

The embodiment described above is only a preferred embodiment of the present invention. All equivalent constructions which employ the concepts disclosed in this specification and the appended claims should fall within the scope of the present invention.

What is claimed is:

1. A testing jig, which contacts a DUT with a plurality of pads thereon, comprising:
    a substrate having a top surface, a recess located on the top surface, and a plurality of circuits located on the top surface;
    a plurality of conductive elastic pieces provided on the substrate to be respectively electrically connected to the circuits, wherein each of the conductive elastic pieces has a contact portion located within an orthographic projection range of the recess to contact one of the pads of the DUT;
    a cushion pad provided in the recess and below the conductive elastic pieces;
    a flexible member located below the cushion pad, wherein the flexible member has a contact end to contact the cushion pad; the contact end of the flexible member corresponds to the contact portions of the conductive elastic pieces; and
    a base located below the substrate, wherein the substrate has a perforation located in the recess to communicate with a bottom surface of the substrate; the flexible member is provided at the base, with the contact end thereof located in the perforation.

2. The testing jig of claim 1, further comprising a plurality of connectors, each of which has a signal electrode and a cover which are separated from each other; wherein the circuits include a plurality of signal circuits and a plurality of grounding circuits; each of the signal electrodes is electrically connected to one of the signal circuits, and each of the covers is electrically connected to one of the grounding circuits.

3. The testing jig of claim 1, further comprising a positioning seat provided on the top surface of the substrate, wherein the positioning seat has a through hole communicating a top surface and a bottom surface of the positioning seat; the contact portions of the conductive elastic pieces are located within an orthographic projection range of the through hole.

4. The testing jig of claim 3, wherein each of the conductive elastic pieces has a bump as the contact portion.

5. The testing jig of claim 4, further comprising a case connected on the base, wherein the case has a tapered opening communicating an inner side of the case and outside; the cross-sectional area of the tapered opening becomes smaller toward the base, wherein a side of the tapered opening which has the smallest cross sectional area communicates with the through hole of the positioning seat.

* * * * *